(12) United States Patent
Sasaki et al.

(10) Patent No.: US 6,783,867 B2
(45) Date of Patent: Aug. 31, 2004

(54) MEMBER FOR SEMICONDUCTOR DEVICE USING AN ALUMINUM NITRIDE SUBSTRATE MATERIAL, AND METHOD OF MANUFACTURING THE SAME

(75) Inventors: Kazutaka Sasaki, Itami (JP); Hirohiko Nakata, Itami (JP); Akira Sasame, Itami (JP); Mitsunori Kobayashi, Itami (JP)

(73) Assignee: Sumitomo Electric Industries, Ltd. (JP)

( * ) Notice: Subject to any disclaimer, the term of this patent is extended or adjusted under 35 U.S.C. 154(b) by 0 days.

(21) Appl. No.: 10/454,288

(22) Filed: Jun. 4, 2003

(65) Prior Publication Data

US 2003/0207146 A1 Nov. 6, 2003

Related U.S. Application Data

(60) Continuation-in-part of application No. 09/412,012, filed on Oct. 4, 1999, now abandoned, which is a division of application No. 08/792,147, filed on Jan. 31, 1997, now Pat. No. 5,998,043.

(30) Foreign Application Priority Data

Feb. 5, 1996 (JP) ............................................. 8-18504
Dec. 17, 1996 (JP) ............................................. 8-336830

(51) Int. Cl.[7] .......................... H01L 23/14; H01L 23/50; B32B 15/04
(52) U.S. Cl. ....................... 428/627; 428/620; 428/660; 428/661; 428/675; 257/705; 228/208; 228/209; 228/262.2; 228/262.21
(58) Field of Search ................................ 428/627, 660, 428/661, 675, 620; 174/258, 256, 259; 257/703, 705; 228/208, 209, 262.2, 262.21, 122.1

(56) References Cited

U.S. PATENT DOCUMENTS

| | | | | |
|---|---|---|---|---|
| 4,886,709 A | * | 12/1989 | Sasame et al. | 428/552 |
| 4,965,659 A | * | 10/1990 | Sasame et al. | 257/720 |
| 5,010,388 A | * | 4/1991 | Sasame et al. | 257/669 |
| 5,034,357 A | * | 7/1991 | Yamakawa et al. | 501/98.4 |
| 5,370,907 A | * | 12/1994 | Yamakawa et al. | 427/376.3 |
| 5,561,321 A | * | 10/1996 | Hirano et al. | 257/700 |
| 5,679,469 A | * | 10/1997 | Shimoda et al. | 428/627 |
| 5,760,466 A | * | 6/1998 | Masuri et al. | 257/672 |
| 5,998,043 A | * | 12/1999 | Sasaki et al. | 428/627 |

FOREIGN PATENT DOCUMENTS

EP 0574956 * 12/1993

* cited by examiner

Primary Examiner—John J. Zimmerman
(74) Attorney, Agent, or Firm—Muserlian, Lucas and Mercanti (57) ABSTRACT

A highly reliable member for a semiconductor device, in which a high melting point metallizing layer, which consists mainly of a high melting point metal such as W and/or Mo, and an intervening metal layer, which has a melting point of not greater than 1,000° C. and consists mainly of at least one selected from among Ni, Cu and Fe, are provided on an AlN substrate material in this order on the AlN substrate material, and a conductor layer consisting mainly of copper is directly bonded to the intervening metal layer without intervention of a solder material layer. A semiconductor element or the like is mounted on the member for a semiconductor device, thereby fabricating a semiconductor device. The high melting point metallizing layer is formed on an aluminum nitride substrate by post-fire or co-fire metallization.

10 Claims, 2 Drawing Sheets

MEMBER FOR SEMICONDUCTOR DEVICE USING AN ALUMINUM NITRIDE SUBSTRATE MATERIAL, AND METHOD OF MANUFACTURING THE SAME

CROSS REFERENCE TO RELEASED APPLICATIONS

This application is a continuation-in-part of U.S. patent application Ser. No. 09/412,012, filed Oct. 4, 1999, now abandoned which is a division of U.S. patent application Ser. No. 08/792,147 filed Jan. 31, 1997, now U.S. Pat. No. 5,998,043.

BACKGROUND OF THE INVENTION

1. Field of the Invention

The present invention relates to a member for a semiconductor device, in which a conductor layer consisting mainly of copper is bonded to an aluminum nitride substrate material, a method of manufacturing such a member for a semiconductor device, and a semiconductor device which employs such a members.

2. Description of the Prior Art

Conventionally, alumina ($Al_2O_3$) has widely been used as an insulating substrate material for a semiconductor package, and a member in which a metallized circuit consisting mainly of tungsten is formed on the insulating substrate material in a multilayer structure has been used as a circuit board for a semiconductor IC. Alumina is superior in electrical insulation and mechanical strength, but its thermal conductivity is as small as approximately 17 W/m.K and its heat dissipation property is inferior. Alumina is, therefore, inappropriate to a circuit board on which to mount a high-capacity semiconductor IC.

In contrast, aluminum nitride (AlN) has recently been spotlighted as a substrate material for a circuit board because of its electrical insulation and mechanical strength approximately equivalent to those of alumina, its light weight and its high thermal conductivity exceeding 100 W/m·K. In addition, aluminum nitride exhibits a mean coefficient of thermal expansion as small as $5.5 \times 10^{-6}$° C. in the temperature range of from the room temperature to the silver-soldering temperature (approximately 800° C.), so that aluminum nitride exhibits superior bondability and compatibility with an Si semiconductor chip (which has a coefficient of thermal expansion of $4.0 \times 10^{-6}/(° C.)$. However, aluminum nitride is poor in bondability with Kovar (having a coefficient of thermal expansion of $10 \times 10^6/°$ C.) and a 42 alloy (having a coefficient of thermal expansion of $11 \times 10^{-6}/°$ C.) which are used for a package material or a through lead to a circuit board.

It is generally known that various intervening layers are formed between nitride ceramic and metal so that the nitride ceramic and the metal are bonded to each other. For example, Japanese Patent Publication No. 2-34908 (1990) states that a layer made of a low-elastic-modulus metal and/or a metal having malleability and ductility, a layer made of a brittle material and a layer made of a material having a low coefficient of thermal expansion are formed as intervening layers in multilayer in this order from the ceramic side. However, bonding which uses these kinds of multiple intervening layers easily lowers the thermal conductivity by the multiple intervening layers provided for bonding purpose, and the application of such bonding to an aluminum nitride heat sink board is limited practically.

For this reason, it has been a common practice to form a metallizing layer of W, Mo or the like on the surface of an aluminum nitride substrate material and bond the aluminum nitride substrate material to a metal member such as a lead frame or a package by silver-soldering via the metallizing layer. For example, Japanese Patent Laid-Open No. 63-269950 (1988) discloses the art of forming a W metallizing layer on an aluminum nitride substrate material and bonding a lead frame made of oxygen free copper having a high heat conductivity and a high thermal shock absorbing property (refer to FIGS. 1 and 2 of Japanese Patent Laid-Open No. 63-289950) to the W metallizing layer by silver-soldering. In this art, if necessary, an Ni layer for improving the wettability is formed on each of the W metallizing layer and the oxygen free copper lead frame, and both are bonded to each other by silver-soldering.

In accordance with the aforesaid method of bonding the oxygen free copper lead frame to the aluminum nitride substrate material via the metallizing layer, thermal stress due to heating during silver-soldering is greatly reduced compared to ordinary lead frames using Kovar or the like, so that the bonding strength which lowers in the case of Kovar does not lower. However, the aforesaid method involves the problem that the shape of the lead frame is difficult to maintain because oxygen free copper is a soft material. In addition, if a copper-based member is joined to an aluminum nitride substrate material via a silver-solder layer in the above-described manner, a large thermal stress action due to the silver-soldering occurs owing to the difference in thermal expansion between the silver-solder and the aluminum nitride, so that breakage or deformation, such as cracking or warp, easily occurs in the aluminum nitride substrate material after the cooling. This leads to the problem that a special expensive silver-solder material which is silver-rich and soft needs to be employed to lower the cooling stress, or strict control for a small-amount region is needed to make the silver-solder layer thinner.

Under the circumstances, investigations have been made into various methods of bonding a metal member which is a conductor to an aluminum nitride substrate material without forming an intervening layer of solder material such as silver-solder. One method is a so-called DBC (direct bonding copper) method which does not use a W metallizing layer nor a solder layer to bond copper as a metal member to an aluminum nitride substrate material.

For example, Japanese Patent Laid-Open No. 59-40404 (1984) discloses a method which includes the steps of forming on the surface of an aluminum nitride substrate material either a layer of an oxide of the aluminum nitride substrate material itself or a binding layer made of an oxide of aluminum, a rare earth element or an alkaline earth element which are used as sintering aids for the preparation of a sintered body of aluminum nitride, preparing, as a counterpart to be bonded to the aluminum nitride substrate material, a metal material which contains a little amount of a binder of such oxide (which may contain oxygen alone) or has such layers formed on its surface in advance, and directly bonding the aluminum nitride substrate material and the metal material by using the affinity between the binding layers on these materials. For example, if the metal material is made of copper, it is bonded to the aluminum nitride substrate material having the oxide layer thereon, using the copper oxide formed on its surface, by subjecting the material to heat treatment in the temperature range of from the eutectic temperature of the copper oxide and copper to the melting point of copper.

A similar method is disclosed in Japanese Patent Laid-Open No. 60-32343 (1985). This method is a bonding method in which a thin copper-alloy eutectic layer containing an active metal (such as Ti, Zr or Hf) is intervened between an aluminum nitride substrate material and a copper heat sink board. Another DBC method is described in "Electronics Ceramics", the November issue, 1988, pp. 17 to 21. In this method, a thin aluminum oxide layer of up to several microns is first formed on the surface of an aluminum nitride substrate material and then copper is bonded to the thin aluminum oxide layer via a $Cu_2O$—Cu eutectic layer.

However, in any of the above-described methods of bonding copper to aluminum nitride by using an eutectic region of a copper oxide and copper, the variation of the bonding strength easily becomes great unless the thickness of the oxide layer on the aluminum nitride is controlled within a narrow range, as illustrated in FIG. 4 of the above-cited report of "Electronic Ceramics". In addition, in these methods, since an intervening layer made of aluminum oxide and a copper oxide eutectic component formed between an aluminum nitride substrate material and a copper member is thin, breakage or deformation such as cracking or warp easily occurs in the substrate material owing to the difference in thermal expansion between copper and aluminum nitride. In addition, it is necessary to create a special oxygen partial-pressure atmosphere for eutectic bonding of copper and copper oxide at around 1,000° C. Since the surface of the copper member is oxidized by the special oxygen partial-pressure atmosphere, an extra step such as surface polishing is needed before the copper member is subjected to solder-bonding. When the copper member is mounted on the aluminum nitride substrate material, it is necessary to carry out the time-consuming step of performing positioning for defining a non-mounting portion, and forming with good reproducibility the boundary between the copper member and a fuse-contact portion on which to mount the copper member.

In the method using an active metal as described in Japanese Patent Laid-Open No. 60-32343 (1985), an expensive active drive solder material is needed, and a high vacuum of not greater than $10^{-4}$ Torr is needed during soldering. In many cases of soldering in nitrogen gas, it is also necessary to prepare a special metal soldering material containing, e.g., a large amount of Ti in advance. Furthermore, if such an active metal solder material is employed, voids are easily produced in the interface between aluminum nitride and the active metal solder material, so that cracking easily occurs therein. Thermal resistance may also increase because of the presence of the soldering material.

SUMMARY OF THE INVENTION

In consideration of the above-described problems, an object of the present invention is to provide a member for a semiconductor device, which has a bonding structure for ensuring high-strength bonding between an aluminum nitride substrate material and a conductor layer so that a metal member can be mounted to an aluminum nitride substrate material with high reliability in a semiconductor device which uses aluminum nitride for a substrate material, particularly in a connection structure for a high-power module in order to form a conductor layer consisting mainly of copper on the aluminum nitride substrate material, by preventing the substrate material from suffering the aforesaid damage during soldering to the W metallizing layer, preventing the substrate material from suffering breakage or deformation when a copper conductor layer is directly bonded to the substrate material by using the aforesaid copper oxide eutectic, preventing breakage of the member due to deformation (deflection) which occurs during the step of fixing the member to a semiconductor device after bonding, preventing increases of the material and working costs required for soldering and mounting.

To achieve the above object, the present invention provides a member for a semiconductor device in which a high melting point metallizing layer, which consists mainly of a high melting point metal, and an intervening metal layer, which has a melting point of not greater than 1,000° C. and consists mainly of at least one selected from the group consisting of nickel, copper and iron, are provided on an aluminum nitride substrate material in this order from the aluminum nitride substrate material, and a conductor layer consisting mainly of copper is directly bonded as a circuit layer to the intervening metal layer, without forming an intervening solder layer.

Specifically, the present invention relates to a member for a semiconductor device, in which a conductor layer consisting mainly of copper which is widely used for use as high-power module, is provided on an aluminum nitride substrate material which is superior in heat dissipation property. In accordance with the present invention, it is possible to provide a semiconductor device such as a high power module by die-bonding a semiconductor device to the conductor layer of the member.

The reliability of conventional direct bonding of a copper heat sink board and an aluminum nitride substrate material via an oxide layer or an activated metal solder layer is extremely low. For example, cracking or warp of the aluminum nitride substrate material or separation of the copper heat sink board is caused by thermal stress which occurs during manufacture or use owing to the difference in thermal expansion between the copper heat sink board and the aluminum nitride substrate material. In addition, in the above-described copper eutectic bonding method using an intervening oxide layer, a groove may be provided in the bonding interface of a copper sheet as a conductor layer and the aluminum nitride substrate material so as to facilitate the forming of the oxide layer on the bonding interface. However, after the bonding, such groove may be left as a gap which lowers the strength. The bonding method using active metal solder may involve a positional deviation during bonding or allow an etchant to enter the bonding interface during etching in the circuit forming step. As a result, a space is produced between the aluminum nitride substrate material and the copper conductor layer, thereby also lowering the bonding strength.

To solve the above-described problems and improve the reliability to a great extent, the present invention provides a structure in which a high melting point metallizing layer and an intervening metal layer which has a melting point of not greater than 1,000° C. and consists mainly of at least one selected from the group consisting of nickel, copper and iron are formed between an aluminum nitride substrate material and a conductor layer consisting mainly of copper, without intervention of a solder layer between the intervening metal layer and the conductor layer. The role of the high melting point metallizing layer is not limited to only plating precipitation, solder-flow stabilization and general surface metallization for circuit formation or the like. The high melting point metallizing layer having a high Young's modulus absorbs the thermal stress due to the difference in thermal expansion between the conductor layer consisting mainly of copper and the aluminum nitride substrate material, thereby relaxing the thermal stress which adversely affects the aluminum nitride substrate material. The role of the intervening metal layer is to melt below 1,000° C. so as to bond the high melting point metallizing layer to the conductor layer which consists mainly of copper. As the material of the intervening metal layer, a material of low hardness or a material which can readily be reduced in thickness is preferable so that the thermal stress generated can be decreased compared to general silver solder or activated metal solder.

It is particularly preferable that the length and width in the plane direction of the conductor layer be shorter than those of the high melting point metallizing layer and the intervening metal layer by not less than 0.05 mm so as to prevent a discharge phenomenon from occurring between the copper sheet, which is the conductor layer, and the aluminum nitride substrate material and to provide a far more reliable member for a semiconductor device. Furthermore, the end shape of the conductor layer formed of the copper sheet is such that the angle formed by the side face of the conductor layer and the bonding interface between the conductor layer and the intervening metal layer is not greater than 80°, whereas the angle formed by the, upper surface and the side face of the conductor layer is not less than 80°. Accordingly, the discharge phenomenon preventing effect is improved to a further extent. The end surface of the conductor layer may be curved outwardly or inwardly in cross section. Incidentally, the end surface of the conductor layer is preferably a surface which is as smooth as possible, and more preferably the Rmax of the end surface is not greater than 20 $\mu$m so that a discharge phenomenon can be prevented from occurring between the conductor layer and the aluminum nitride substrate material. For the same reason, it is preferable that none of the corners or the edges of the conductor layer have a projection such as a burr, and, more particularly, small rounded surfaces are provided on the respective corners or edges of the conductor layer.

A sintered body of aluminum nitride which Is employed as an aluminum nitride substrate material may contain generally known additives such as a rare earth element compound such as $Y_2O_3$, an alkaline earth element compound such as CaO, and, if necessary, a transition element compound such as TiN. The sintered body has a relative density of not less than 95%, preferably not less than 98%. The thermal conductivity of the sintered body is preferably not less than 100 W/m·K, more preferably not less than 150 W/m·K. Incidentally, a thin layer containing oxygen may previously be formed on the surface of the aluminum nitride substrate material on which to form a metallizing layer. This thin layer is mainly intended to accelerate the bonding of the aluminum nitride substrate material and the high melting point metallizing layer, and contains, for example, Al, Si, a rare earth element, an alkaline earth element, and oxygen.

The high melting point metallizing layer consists mainly of a high melting point metal such as W, Mo, Ta, Ti and/or Zr. In order to improve its bondability with aluminum nitride, the high melting point metallizing layer may contain a glass frit which contains the aforesaid elements added to the sintered body, such as a rare earth element, an alkaline earth element, Si, Al and other transition elements. It is desirable that the thickness of the high melting point metallizing layer be 3–50 $\mu$m.

The intervening metal layer provided on the high melting point metallizing layer is preferably a layer of a composition having a melting point of not greater than 1,000° C. and comprising as a main component at least one selected from the group consisting of Ni, Fc and Cu. Two or more intervening metal layers may be formed. The thickness of this intervening metal layer is preferably 2–40 $\mu$m, and more preferably 5–20 $\mu$m. An Ni—P composition is the one suited to the intervening metal layer, and a structure in which a layer of Ni—P composition is formed on a layer of Ni—B composition is particularly preferable.

The material of the conductor layer which consists mainly of copper and which is bonded to the aluminum nitride substrate material via the above-described two layers may be copper such as oxygen free copper or tough pitch copper, a copper alloy such as a copper-molybdenum alloy, a copper-tungsten alloy or a copper-molybdenum-tungsten alloy, or a clad material such as copper-molybdenum-copper having both a high electrical conductivity and a low coefficient of thermal expansion. A metal member which is disposed around aluminum nitride in a semiconductor device, and made of, for example, an Fe—Ni—Co alloy such as Kovar, an Fe—Ni alloy such as a 42 alloy, Ni, an Ni alloy, Cu, a Cu alloy, W, Mo, a W alloy, or an Mo alloy may be directly or indirectly bonded to the conductor layer, as required.

Methods of manufacturing a member for a semiconductor device according to the present invention will be described below. First, a high melting point metallizing layer is formed on the above-described aluminum nitride substrate material. One of the methods of forming the high melting point metallizing layer includes the steps of preparing a sintered body of aluminum nitride in advance, subjecting the sintered body to the above-described surface treatment (forming an oxygen-containing thin layer) if necessary, coating the resultant sintered body with a paste, which comprises, as a main component, a metal selected from among the aforesaid high melting point metals, a mixture thereof, or a mixture of such metal or metals and the aforesaid glass frit, is mixed with an organic binder (viscous material) and an organic solvent (viscosity modifier of the binder), for example, by printing to form a layer, preferably with a thickness of 5–60 $\mu$m, and firing the layer. This procedure is a so-called post-fire metallizing method.

There is another method which includes the steps of adding a forming organic binder to an aluminum nitride material powder mixture with a predetermined composition, compacting the obtained mixture into a compact, coating the compact with a high melting point metal paste similar to the above-described one, and firing the paste and sintering the compact at the same time. This method is a so-called co-fire metallizing method. In the case of this method, it is important that high melting point metal grains as fine as possible are used for the high melting point metal paste and an agent which produces a liquid phase at low temperatures is selected as an additive for acceleration of sintering of aluminum nitride so that the sintering can be effected by cofiring at the same time at a lower temperature and their shrinkage factors can be made approximately equal to each other, thereby preventing deformation of the aluminum nitride substrate material during sintering. In addition, it is expected that since the crystal grains of the aluminum nitride substrate material are made fine by sintering at low temperatures, the strength of the aluminum nitride substrate material is increased.

After the high melting point metallizing layer has been formed in the above-described manner, an intervening metal layer having a composition which has a melting point of not greater than 1,000° C. and comprises, as a main component, Ni, Cu and/or Fe is formed. This intervening metal layer may be formed by any of the following methods: (1) forming the intervening metal layer on the bonding interface of the conductor layer consisting mainly of copper to be bonded to the aluminum nitride substrate material; (2) forming the intervening metal layer on the high melting point metallizing surface of the aluminum nitride substrate material; and (3)

forming the intervening metal layer on both of the high melting point metallizing layer formed on the aluminum nitride substrate material and the conductor layer comprising copper as a main component. Two or more intervening metal layers of different kinds may be formed, as required. For example, in a representative example in which a nickel-phosphorus layer is formed on the high melting point metallizing layer on the aluminum nitride substrate material, after a high melting point metallized surface is subjected to nickel-boron plating, nickel-phosphorus plating may be applied to the nickel-boron-plated surface.

After that, the aluminum nitride substrate material and a material prepared for forming the conductor layer comprising copper as a main component are superposed on each other, with the intervening metal layer formed by any of the above-described methods sandwiched therebetween in which the conductor layer is directly bonded as a circuit layer to the intervening metal layer without any solder layer; and the aluminum nitride substrate material and the conductor layer are bonded to each other by firing in a nitrogen-containing atmosphere at a temperature less than the melting point of the conductor layer, thus producing a member for a semiconductor device according to the present invention. The strength of the bonded portion of the member for a semiconductor device according to the present invention is stable at a high peel strength of not less than 0.5 kg/1 mm.

Incidentally, during the aforesaid sintering for bonding, if necessary, the aluminum nitride substrate material and the conductor layer may be temporarily fixed by using a setting jig made of a refractory material such as a carbon material, an alumina material or an aluminum nitride material, and, if further necessary, an appropriate load may be applied to a set in which both are superposed one on the other.

DETAILED DESCRIPTION OF THE PREFERRED EMBODIMENTS

The reason why the relative density of the aluminum nitride substrate material used in the present invention is preferably not loss than 95% is that the strength of its sintered body lowers when the relative density is less than 95% and if such a sintered body is employed as a product, the reliability against thermal shock may become low. The reason why the thermal conductivity of the aluminum nitride substrate material is preferably at least 100 W/m·K is that, at a thermal conductivity of less than 100 W/m·K, it is difficult to achieve effective dissipation of heat generated during the operation of an element, particularly in the case of a power element.

The composition of the high melting point metallizing layer after tiring preferably contains a high melting point metal in an amount of not less than 80 volume % and the aforesaid type of glass frit in an amount of not greater than 20 volume %. If the content of the high melting point metal is less than 80 volume % or the content of the glass frit exceeds 20 volume %, the thermal conductivity of the high melting point metallizing layer may lower. It is desirable to control the thickness of the high melting point metallizing layer after firing within 3–50 μm. If such thickness is less than 3 μm, it may be impossible to provide a satisfactory mechanical adhesion between the high melting point metallizing layer and the aluminum nitride substrate material, whereas it the thickness exceeds 50 μm, the warp of the aluminum nitride substrate material tends to increase after the formation of the intervening metal layer.

The intervening metal layer has a composition which consists mainly of Ni, Fe and/or Cu and has a melting point of not greater than 1,000° C., and it is particularly desirable to use a nickel-phosphorus composition as described previously. The reason why the nickel-phosphorus intervening metal layer is preferable in the present invention is as follows. A eutectic Ni—P is formed at the interface at a temperature lower than the melting temperature of Ni itself and the reaction is accelerated, so that since Ni melts at this time, a good bonding can be provided between the conductor layer and W or the like of the high melting point metallizing layer.

The thickness of the intervening metal layer is preferably 2–40 μm immediately after sintering. If the thickness is less than 2 μm, a sufficient liquid phase for bonding is not obtained and an unbounded portion easily occur, so that thermal resistance may increase and stress due to the difference in heat shrinkage between the metallic portion of the copper conductor layer and AlN may concentrate. If the thickness exceeds 40 μm, since Ni—P is a metal having a high Young's modulus, the absolute value of the difference in thermal stress between Ni—P and the aluminum nitride substrate material increases as the bonding area between Ni—P and the aluminum nitride substrate material increases, so that an excessive stress is applied to the aluminum nitride substrate material and the strength thereof may be degraded.

Incidentally, either electrolytic plating or electroless plating may be used as a plating method for forming the intervening metal layer. As another method of forming the intervening metal layer, printing, vapor deposition or the like may also be adopted other than the plating. The thus-formed intervening metal layer is preferably sintered in a non-oxidizing atmosphere.

The bonding of a conductor layer material and the aluminum nitride substrate material on which the intervening metal layer has previously been formed on the metallizing layer is carried out at a temperature of less than the melting point of the conductor layer material in a nitrogen-containing atmosphere, without forming a solder layer on the intervening metal layer. It is not preferable that the bonding temperature be not less than the melting point of the conductor layer material, because the desired dimensions of the conductor layer are not obtained after bonding and a predetermined circuit pattern which has previously been formed on the conductor layer is damaged, with the result that the predetermined circuit pattern may be short-circuited. Incidentally, the member for a semiconductor device according to the present invention can also be adapted to a high-power module board, for example, a structure which uses a conductor layer consisting mainly of aluminum instead of copper.

EXAMPLE 1

An AlN powder of 1.2 μm in mean grain size, $Y_2O_3$ powder of 0.6 μm in mean grain size, and CaO powder of 0.3 μm in mean grain size were prepared in weight percentages of 9 wt. %, 1.5 wt. % and 1.5 wt. %, respectively, and the thus-prepared powders were uniformly mixed for 24 hours in an ethanol solvent by means of a ball mill. Then, 10 parts by weight of PVB were added to 100 parts by weight of the powder mixture, thus preparing a slurry.

Part of the slurry was spray-dried and then compacted into a plate shape by a powder compacting press. Then, the compacted product was sintered at 1,700° C. in a nitrogen atmosphere for 5 hours, thereby preparing a plate sintered body of AlN. One side of the obtained AlN sintered body was coated with a paste comprising, as a main component, a W powder of 1 μm in mean grain size and containing 5 wt. % of an $SiO_2$-based frit. After de-gassing, the sintered body was fired at 1,600° C. in a nitrogen atmosphere, thus forming a high melting point metallizing layer (the post-fire metallizing method).

The remainder of the slurry was formed into a sheet of 1.0 mm thick×100 mm wide by a doctor blade method, and then formed into a plate product by blanking. The thus formed plate product was similarly coated with the same paste above-described, and after de-gassing, the thus-coated plate product was fired at 1,700° C. in a nitrogen atmosphere for 5 hours, thereby effecting firing of the paste and sintering of aluminum nitride at the same time (the co-fire metallizing method).

Metallized AlN substrate materials of the kinds shown in Table 1, each of which had a W high melting point metallizing layer, were produced by either of the above-described methods. Incidentally, the materials produced by the post-fire metallizing method and those produced by the co-fire metallizing method were of the same shape. The sintered aluminum nitride exhibited a density of 99% and no voids were observed in its surface, and its thermal conductivity ranged from 150 W/m·K to 160 W/m·K.

TABLE 1

| Sample | Size of Metallized AlN Substrate Material | | | Thickness of Metallizing layer (μm) |
|---|---|---|---|---|
| | Length (mm) | Width (mm) | Thickness (mm) | |
| 1 | 25 | 25 | 0.635 | 2 |
| 2 | 25 | 25 | 0.635 | 3 |
| 3 | 25 | 25 | 0.635 | 5 |
| 4 | 25 | 25 | 0.635 | 10 |
| 5 | 25 | 25 | 0.635 | 20 |
| 6 | 25 | 25 | 0.635 | 50 |
| 7 | 25 | 25 | 0.635 | 60 |
| 8 | 25 | 25 | 0.635 | 70 |
| 9 | 50 | 50 | 0.635 | 5 |
| 10 | 50 | 50 | 0.635 | 10 |
| 11 | 50 | 50 | 0.635 | 15 |
| 12 | 50 | 50 | 0.635 | 20 |
| 13 | 100 | 100 | 0.5 | 5 |
| 14 | 100 | 100 | 0.5 | 10 |
| 15 | 100 | 100 | 0.5 | 15 |
| 16 | 100 | 100 | 0.5 | 20 |

Ten samples were selected from each of the sample groups, and after the high melting point metallized surfaces of the selected samples were plated with Ni—P, the plated samples were held at 600° C. for 30 minutes in a nitrogen atmosphere, thus sintering the Ni—P plating layers. Any abnormality such as blister or peeling was not observed in any of the obtained intervening metal layers, and the plating thickness of any of the samples was in the range of 6±0.3 μm.

As a conductor layer, an electrolytic copper material of JIS C1020 which was 1 mm thick and equal in length and width to the AlN substrate material was placed on each of the samples, and the samples were placed on a graphite-made setter and were subjected to in-furnace bonding at 970° C. for 30 minutes under a no-load condition in a nitrogen gas flow. An area analysis using an ultrasonic flaw detector was made on each of the samples after bonding, and no abnormal detect was observed. In addition, the cross section of each of the samples after bonding was observed with an SEM (scanning electron microscope) (magnification: ×1,000), defects such as cracks or pin holes were not observed at the interface.

Figure 1:
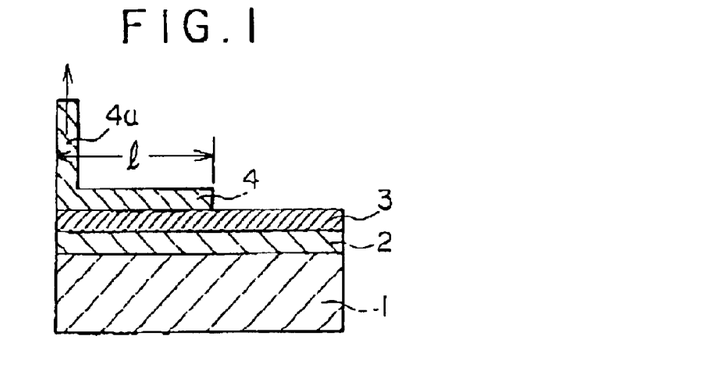
FIG. 1 is a cross-sectional view illustrating a method of measuring the peel strength of the bonded portion of a member for a semiconductor device according to the present invention.

The peel strength and the warp of each of the obtained samples were measured, and the results were classified into a data group based on the post-fire metallizing method and a data group based on the co-fire metallizing method. The respective data groups are shown in Tables 2 and 3. The warp was obtained by placing each of the samples on a surface plate with its conductor layer faced up, measuring the difference between the maximum height and the minimum height from the surface plate of each of the samples on a diagonal line thereof, and converting the difference into a value per millimeter of the diagonal. The peel strength of the bonded portion of each of the samples was measured by, as shown in FIG. 1, bonding a conductor layer 4 of 0.1 mm thick×4.0 mm wide to an intervening metal layer 3 provided on a nigh melting point metallizing layer 2 of an AlN substrate material 1, in such a manner as to make the length "1" equal to 3 mm, and then pulling a grip portion 4a projecting perpendicularly upwardly from one end of the conductor layer 4, in the upward direction at a speed of 20 mm/min.

TABLE 2

Post-Fire Metallizing Method

| Sample | Peel Strength (kg/1 mm) | Warp (μm/mm) |
|---|---|---|
| 1 | 0.5–0.6 | 0.2–0.3 |
| 2 | 0.7–1.2 | 0.3–0.4 |
| 3 | 1.4–1.8 | 0.6–0.8 |
| 4 | 1.5–1.9 | 1.0–1.2 |
| 5 | 1.5–1.7 | 1.8–2.1 |
| 6 | 1.4–1.9 | 2.0–2.1 |
| 7 | 1.6–1.8 | 2.3–2.4 |
| 8 | 1.5–1.6 | 2.4–2.6 |
| 9 | 1.3–1.8 | 0.7–0.9 |
| 10 | 1.7–2.0 | 1.1–1.3 |
| 11 | 1.6–1.8 | 1.7–2.1 |
| 12 | 1.7–1.9 | 2.1–2.3 |
| 13 | 1.2–1.8 | 0.6–0.9 |
| 14 | 1.6–2.1 | 1.1–1.3 |
| 15 | 1.7–2.0 | 1.9–2.2 |
| 16 | 1.7–1.9 | 2.1–2.2 |

TABLE 3

Co-Fire Metallizing Method

| Sample | Peel Strength (kg/1 mm) | Warp (μm/mm) |
|---|---|---|
| 1 | 0.5–0.6 | 0.4–0.5 |
| 2 | 0.8–1.4 | 0.4–0.5 |

TABLE 3-continued

Co-Fire Metallizing Method

| Sample | Peel Strength (kg/1 mm) | Warp (μm/mm) |
|---|---|---|
| 3 | 2.6–3.2 | 0.6–0.8 |
| 4 | 2.8–3.2 | 1.1–1.3 |
| 5 | 3.1–3.4 | 1.7–2.0 |
| 6 | 3.3–3.5 | 2.2–2.4 |
| 7 | 3.4–3.8 | 2.4–2.6 |
| 8 | 3.0–3.5 | 2.5–2.8 |
| 9 | 2.8–3.8 | 0.8–1.0 |
| 10 | 2.8–3.2 | 1.1–1.4 |
| 11 | 3.2–3.5 | 1.8–2.2 |
| 12 | 3.1–3.9 | 2.2–2.3 |
| 13 | 2.8–3.4 | 0.7–1.0 |
| 14 | 3.2–3.4 | 1.2–1.4 |
| 15 | 3.4–3.5 | 2.0–2.2 |
| 16 | 3.0–3.8 | 2.1–2.2 |

As can be seen from the above results, according to the structure of the present invention, even a large-size substrate material of 25 mm long×25 mm wide only exhibited practically allowable levels of a warp of approximately 3.0 μm/mm at the most and a peel strength of approximately 0.5 kg/mm at a minimum. In addition, it can be seen that when the thickness of the high melting point metallizing layer was 3 μm to 50 μm, the peel strength exceeded 0.5 kg/1 mm and the warp became less than 3.0 μm/mm, so that a high melting point metallizing layer could be obtained at a practically sufficiently stable level.

From the data of Tables 2 and 3, the following points are apparent when the post-fire metallizing method and the co-fire metallizing method are compared. The peel strengths of the co-fired metallized products are approximately twice as high as those of the post-fired metallized products. This is because, unlike the post-fire metallizing method in which only W on the sintered body is fired, in the co-fire metallizing method in which W is fired at the same time of the sintering of a compacted product, W and AlN are firmly bonded to each other by a so-called anchor effect and W itself becomes dense.

COMPARATIVE EXAMPLE

Using AlN substrate materials metallized by co-fire metallization having the same sizes as those of samples 4, 10 and 14 of Example 1 and non-metallized AlN substrate materials prepared for the post-fire metallization of the samples 4, 10 and 14, a Cu-made metal member having the same length and width as those of Example 1 was bonded to each of the metallized or non-metallized AlN substrate materials by a conventional known method, i.e., silver soldering or copper eutectic bonding. Thus, 10 samples were prepared for each of the AlN substrate materials.

For silver soldering, a 13 Ag-8 silver solder material (Ag 78%-Cu 22%) conforming to the Japanese Industrial standards was employed as a solder material. The same metallized AlN substrate materials and Cu-made metal members as those used in Example 1 were bonded to each other by holding them at 780° C. for 30 minutes under a no-load condition in a nitrogen atmosphere. In copper eutectic bonding, the non-metallized AlN substrate materials having the same sizes as those of the respective samples 4, 10 and 14 were surface-oxidized at 1,100° C. in air to form $Al_2O_3$ layers on the respective AlN substrate materials, and Cu-made metal members, each of which had the same length and width as those of the AlN substrate material, and had an oxidized surface of $Cu_2O$ and a thickness of 0.3 mm, were placed on and bonded to the respective AlN substrate materials having the $Al_2O_3$ layers formed on their surfaces.

In the observation of the appearance of each bonding interface, particularly in each of the sample 10 of 50 mm×50 mm and the sample 14 of 100 mm×100 mm, small cracks were observed in its ceramic portion, and small voids were observed in the portion between the solder material layer and the Cu-made metal member and in the portion between the Cu eutectic layer and the Cu-made metal member, in the bonding layer. Incidentally, although abnormal defects such as cracks or voids were not externally observed in the sample 4 of 25 mm×25 mm, approximately 30% of defective portions (vacant portions) were detected even in the sample of 25 mm×25 mm by an area analysis using a ultrasonic flaw detector.

The peel strength and the warp of each of the aforesaid samples were measured similarly to Example 1, and the results are shown in Table 4. Incidentally, in the case of copper eutectic bonding, the peel strength and the warp were measured by similarly pulling up the portion of the copper-made metal member which was bonded directly to the AlN substrate material without using any intervening layer. Furthermore, each of the samples was subjected to a heating-cooling heat cycle (thermal shock) test in which each sample was subjected to 10-cycles of repetition of 0° C.×15 min→100° C.×15 min. The results are also shown In Table 4. In Table 4, the term "cracking" means that the AlN substrate material cracked in its thickness direction, and the term "peeling" means that the bonded portion peeled off near the interface between the AlN substrate material and the Cu-made metal member. In the case of each of the aforesaid 3 samples of the present invention in which a Cu-made metal member which had the same shape as the aforesaid one and was not subjected to oxidation treatment wad bonded to the Ni—P intervening layer of the AlN substrate material prepared by the co-fire metallizing method, cracks such as those observed in the comparative example were not at all observed after the thermal shock test.

TABLE 4

| Sample | Sample Size | Bonding Method | Peel Strength (kg/ 1 mm) | Warp (μm/mm) | Evaluation after 10 Cycles of Thermal Shock |
|---|---|---|---|---|---|
| 4-a | 25 mm × 25 mm | Ag Solder | 1.2–2.0 | 1.3–1.8 | Cracking |
| 10-a | 50 mm × 50 mm | Ag Solder | 1.2–2.0 | 2.3–3.0 | Cracking |
| 14-a | 100 mm × 100 mm | Ag Solder | Unmeasureable | 3.4–4.6 | Cracking |
| 4-b | 25 mm × 25 mm | Cu Eutectic | 1.5–2.2 | 1.4–2.1 | Peeling |
| 10-b | 50 mm × 50 mm | Cu Eutectic | 1.5–2.2 | 2.6–3.8 | Cracking |
| 14-b | 100 mm × 100 mm | Cu Eutectic | Unmeasurable | 3.6–4.8 | Cracking |

From the above results, the following points become apparent, by comparing with the aforesaid products of Example 1 of the present invention. Any of the products using Ag soldering or Cu eutectic bonding is broken or undergoes peeling of a bonded portion, owing to thermal shock. This is because thermal stress occurs since the coefficient of thermal expansion of each of Ag—Cu and Cu is large compared to AlN. In the case of Ag soldering and Cu eutectic bonding, the warp after bonding is large, so that a product of not less than 15 mm×15 mm is difficult to produce. This is because the coefficients of thermal expansion of Ag solder and Cu are large. Incidentally, it is considered that the cause of the fact that Ag-soldering bonding leads to a slightly smaller warp than that of Cu eutectic bonding is the stress relaxation due to W.

EXAMPLE 2

Metallized AlN substrate materials each having a metallizing layer formed by post-fire metallizing under the same conditions as those of sample 4 shown in Table 1 of Example 1 were prepared, and an intervening metal layer having a thickness within 6±0.3 μm was formed on the entire metallizing layer by Ni—P plating in a manner similar to that used in Example 1. An abnormality such as blister or peeling was not observed in any of the intervening metal layers.

Then, copper materials of JIS C1020 of 0.3 mm in thickness were placed on the surfaces of the respective intervening metal layers, and these sets were disposed on a graphite-made setter and were subjected to in-furnace bonding at 900° C. for 30 minutes under a no-load condition in a nitrogen gas flow, thereby forming conductor layers. In this case, the copper materials were changed with respect to the length and width in the planar direction of each intervening metal layer, as shown in Table 5. Thus, 120 samples were produced for each size of the Cu materials. Area analysis using an ultrasonic flaw detector was made on the bonded surfaces of the 120 samples, and no abnormal defect was observed. In addition, the cross section of each of 5 samples extracted from each sample group after bonding was observed with an SEM (scanning electron microscope) (magnification: ×1,000), defects such as cracks or pin holes were not observed at their interfaces.

Then, the peel strength and the warp of 15 samples extracted from each sample group were measured in a method similar to that used in Example 1, and it was found out that the peel strength and the warp of each of the 15 samples were equivalent to those of the sample 4 shown in Table 3. After that, a check was made on the presence or absence of degradation in the dielectric strength of each of the remaining 100 samples for each group before and after the application of AC 1,000 V×10 min. The results are also shown in Table 5. From the results shown in Table 5, it can be seen that the probability of occurrence of degradation phenomenon of the dielectric strength is small when the planar length and width of the conductor layer are equal to or smaller than the corresponding length and width of the intervening metal layer. It can also be seen that if the differences in length and width between the intervening metal layer and the conductor layer, which are obtained by subtracting the length and width of the conductor layer from those of the intervening metal layer are 0.05 mm or larger, the degradation phenomenon of the dielectric strength does not occur.

TABLE 5

| Sample | Difference in Length and Width of Intervening Metal Layer Conductor Layer | | Number of Samples which Degraded in |
|---|---|---|---|
| | Lengthwise (mm) | Breadthwise (mm) | Dielectric Strength among 100 Samples |
| 17 | 0.25 | 0.25 | 0 |
| 18 | 0.10 | 0.10 | 0 |
| 19 | 0.07 | 0.07 | 0 |
| 20 | 0.05 | 0.05 | 0 |
| 21 | 0 | 0 | 0 |
| 22 | −0.03 | −0.03 | 5 (No Problem in Practical Use) |
| 23 | 0.07 | −0.03 | 3 (No Problem in Practical Use) |
| 24 | −0.03 | 0.07 | 3 (No Problem in Practical Use) |

EXAMPLE 3

Figure 2:
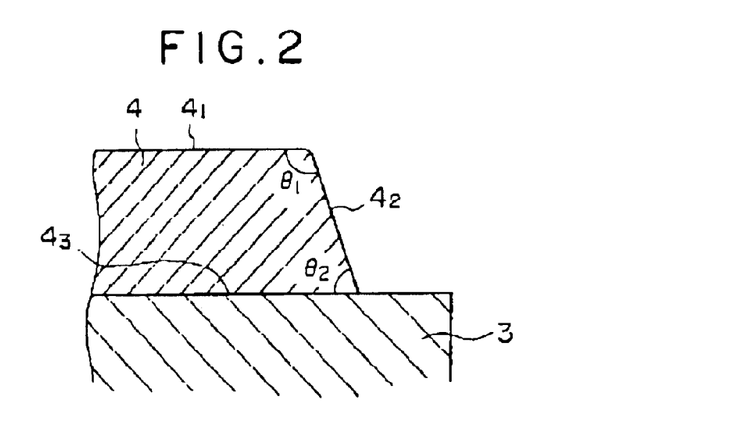
FIG. 2 is a schematic explanatory view showing the end shape of a conductor layer according to the present invention.

A metallizing layer and an intervening metal layer by nickel-phosphorus plating were formed under the same conditions as described in Example 2, and a conductor layer was formed of a copper material identical to that of Example 2, under the conditions similar to those of Example 2. In this case, as shown in FIG. 2, the planar length and width of the conductor layer 4 were made 0.10 mm shorter than those of the intervening metal layer 3 and all the side faces of this copper material were etched so that the angle $\theta_1$ formed by the upper surface $4_3$ and a side face $4_2$ of the conductor layer 4 and the angle $\theta_2$ formed by the side face $4_2$ of the conductor layer 4 and a bonding interface $4_3$ between the conductor layer 4 and the intervening metal layer 3 were shown in Table 6.

Although an area analysis using an ultrasonic flaw detector was made on all 120 samples for each case prepared in the above-described manner, no abnormal detects were observed, and no defects were observed in 5 samples extracted from each sample group even by a cross-section observation similar to that preformed in Example 2. The peel strength and the warp of each of extracted samples by a method similar that used in Example 2 were measured, and it was confirmed that the peel strength and the warp of each sample were equivalent to those or the sample 4 shown in Table 3. After that, each of 100 samples was bonded to a copper-made heat sink board by using a eutectic solder, thus preparing semiconductor device each having the structure shown in FIG. 3.

Figure 3:
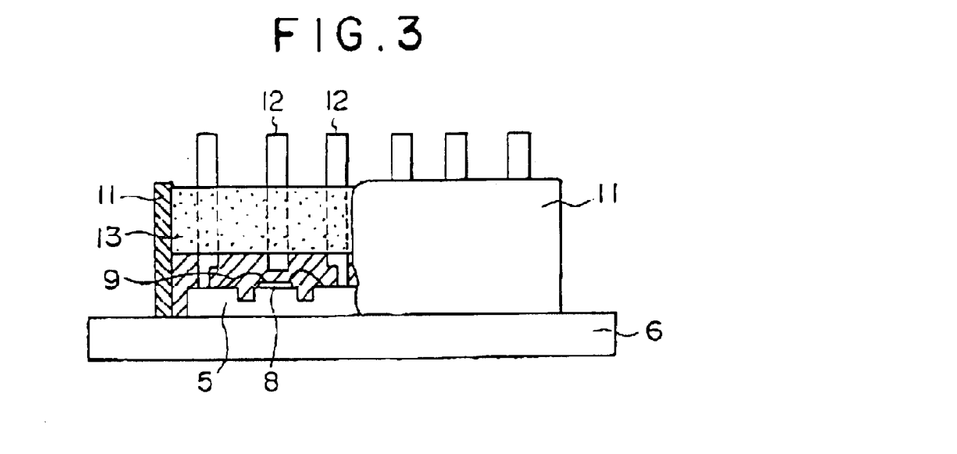
FIG. 3 is a partly cutaway, side elevational view schematically showing a semiconductor device of the present Invention which was produced in Examples 3 and 8.
Figure 4:
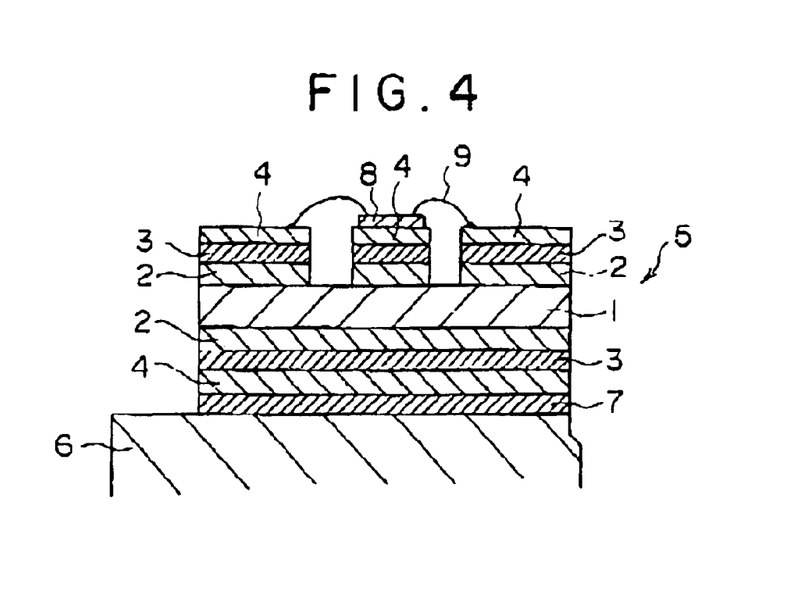
FIG. 4 is a schematic cross-sectional view showing a member for a semiconductor device of the present invention which member was produced in Examples 3 and 8.

Specifically, as shown in FIG. 4, the structure of a member 5 formed by each of the samples was such that a W high melting point metallizing layer 2, an Ni—P intervening metal layer 3 and a copper conductor layer 4 are bonded to each side of the AlN substrate material 1 in multilayer in this order. This member 5 was bonded to a copper-made heat sink board 6 by using a eutectic solder 7, and a semiconductor element 8 was bonded to one of the copper conductors 4 by die-bonding and was connected to another copper conductor 4 via leads 9. Then, as shown in FIG. 3, the obtained product was accommodated into a casing 11 provided with external terminals 12 and the casing 11 was filled with a resin filler layer 13, thus preparing a semiconductor device.

A voltage is applied to each of the 100 semiconductor devices for each sample group in which the members were incorporated, under the same condition as of Example 2, and variations in dielectric strength before and after the application of the voltage were measured. The results is shown in Table 6. No degradation in dielectric strength was observed before and after the application of the voltage, in any sample in which the angle $\theta_1$ (shown in FIG. 2) formed by the upper surface $4_1$ and the side face $4_2$ of the conductor layer 4 was not less than 80° and the angle $\theta_2$ (shown in FIG. 2) formed by the side face $4_2$ of the conductor layer 4 and the bonding interface $4_3$ between the conductor layer 4 and the intervening metal layer 3 was not greater than 80°. However, in any sample in which the angle $\theta_1$ was less than 80° and/or the angle $\theta_3$ was greater than 80°, degradation in dielectric strength due to deterioration of resin caused by discharge from the conductor layer 4 was observed. Incidentally, in any of the samples, no defect due to cracking or warp was observed around the peripheries of the AlN substrate material and the conductor layer of the semiconductor device after the application of the voltage.

TABLE 6

| Sample | Angle $\Theta_1$(°) | Angle $\Theta_2$(°) | Number of Samples which Degraded in Dielectric Strength among 100 Samples |
|---|---|---|---|
| 25 | 85 | 75 | 0 |
| 26 | 100 | 55 | 0 |
| 27 | 85 | 85 | 1 (No Problem in Practical Use) |
| 28 | 100 | 85 | 2 (No Problem in Practical Use) |
| 29 | 85 | 100 | 1 (No Problem in Practical Use) |
| 30 | 40 | 100 | 1 (No Problem in Practical Use) |
| 31 | 50 | 140 | 1 (No Problem in Practical Use) |
| 32 | 85 | 100 | 1 (No Problem in Practical Use) |

EXAMPLE 4

Metallized AlN substrate materials each of which had a high melting point metallizing layer formed on an AlN substrate material by post-fire metallization and had the same size as that of sample 10 of Example 1 were prepared, and intervening metal layers of different thicknesses of 3 μm, 4 μm, 5 μm, 8 μm, 10 μm, 40 μm and 50 μm were respectively formed on the high melting point metallizing layers by Ni—P plating. Thus, ten samples were prepared for each of these seven different thicknesses of the intervening layers.

Then, Cu plates of JIS C1020 each having a thickness of 0.3 mm and the same length and width as the AlN substrate material were placed on the respective intervening metal layers of Ni—P, and the Cu plates were bonded to the respective intervening metal layers by heating under conditions similar to those of Example 1. The peel strength and the warp of each of the obtained samples were measured in a method similar to that of Example 1, and defective portions were evaluated by an area analysis using an ultrasonic flaw detector. The results are shown in Table 7.

TABLE 7

| Sample | Plating Thickness (μm) | Peel Strength (Kg/1 mm) | Warp (μm/mm) | Area Analysis by Ultrasonic Flaw Detector Defective Portion (%) |
|---|---|---|---|---|
| 33 | 3 | 0.6–0.9 | 1.4–2.0 | 14 (Practicable) |
| 34 | 4 | 0.7–0.9 | 1.5–2.4 | 5 (Practicable) |
| 35 | 5 | 0.5–1.6 | 1.4–2.0 | 0 (Practicable) |
| 36 | 8 | 1.5–1.7 | 1.6–2.3 | 0 (Practicable) |
| 37 | 10 | 1.4–1.8 | 1.3–3.3 | 0 (Practicable) |
| 38 | 40 | 1.5–1.8 | 1.3–2.0 | 0 (Practicable) |
| 39 | 42 | 1.7–1.8 | 2.6–2.9 | 0 (Practicable) |

In addition, AlN substrate materials metallized by post-fire metallizing, each of which had the same size as that of the sample 10 of Example 1 were prepared. The metallized AlN substrate materials were subjected to Ni—P plating of 8 μm and sintered. 0.3-mm-thick Cu plates identical to the aforesaid ones were bonded at a temperature of 850–1000° C. by heating under conditions similar to those of Example 1. Evaluation similar to the aforesaid one was made on each of the obtained samples. The results are shown in Table 8. It can be seen from the results that in the case of sample 44 exposed to a bonding temperature exceeding the melting point of Cu, the Cu plate melted and no good bonding was obtained.

TABLE 8

| Sample | Bonding Temperature (° C.) | Peel Strength (kg/1 mm) | Warp (μm/mm) | External Appearance | Area Analysis by Ultrasonic Flaw Detector Defective Portion (%) |
|---|---|---|---|---|---|
| 40 | 880 | 1.6–1.8 | 1.3–1.6 | Good | 20 (Practicable) |
| 41 | 900 | 1.5–1.7 | 1.4–1.7 | Good | 4 (Practicable) |
| 42 | 950 | 1.8–2.0 | 1.4–1.8 | Good | 0 (Practicable) |
| 43 | 1070 | 1.7–1.9 | 1.3–1.7 | Good | 0 (Practicable) |
| 44* | 1090 | Unmeasureable | | Cu melted | (Unpracticable) |

(Note) The sample marked with * is a comparative example.

EXAMPLE 5

Metallized AlN substrate materials each having the same size as that of sample 10 of Example 1 and a high melting point metallizing layer formed by a post-fire metallizing method similar to that used in Example 1 were prepared. Thus, ten metallized AlN substrates were prepared for each sample. Copper plates each having a bonding surface of the same size (length and width) as that at the substrate material and a thickness of 0.3 mm were prepared separately from the metallized AlN substrate materials. After the bonding surfaces of the respective copper plates to be bonded to the metallized AlN substrate materials were subjected to Ni—B plating of 3 μm, Ni—P platings and Cu—Zn platings of various thicknesses were formed, thereby forming intervening metal layers.

The intervening metal layers of some of the copper plates and the metallized surfaces of some of the AlN substrate materials were put together, and were bonded together under the same conditions as described in Example 1 (samples 45 to 51). In addition, the other metallized AlN substrate materials were subjected to the aforesaid plating, and the obtained products were respectively bonded to the above-mentioned copper plates under the same conditions as set forth in Example 1 (samples 52 to 58).

The peel strength and the warp of each of the obtained samples were measured by a method similar to that of Example 1. The results are shown in Table 9 together with the results of observation of their external appearances and the results of area analysis using an ultrasonic flaw detector. It can be seen from Table 9 that when the thickness of the intervening metal layer is controlled within the range of 3–40 μm, a far better bonding can be obtained, whichever side is covered with the intervening metal layer.

lizing under conditions similar to those of sample 10 of Example 1 were coated with an Ni paste containing 12 mole % of P by screen printing, and after the Ni paste was dried in a belt furnace, Cu plates were bonded to the substrate materials under the same conditions as those of Example 1. Each of the obtained samples was evaluated in the above-mentioned manner. The results are shown in Table 11 according to the thicknesses of the intervening Ni—P layers. It can be seen from the results that even if the intervening metal layer is formed by a method other than plating, it is possible to achieve an effect similar to that of an intervening metal layer formed by plating.

TABLE 9

| Sample | Kind of Plating | Plating Thickness (μm) | Peel Strength (kg/ 1 mm) | Warp (μm/mm) | External Appearance | Area Analysis by Ultrasonic Flaw Detector Defective Portion % |
|---|---|---|---|---|---|---|
| 45 | Ni-P | 3 | 0.7–0.9 | 1.2–1.6 | Good | 20 (Practicable) |
| 46 | Cu-Zn | 4 | 0.6–0.9 | 1.4–1.7 | Good | 15 (Practicable) |
| 47 | Ni-P | 5 | 2.0–2.4 | 1.3–1.6 | Good | 3 (Practicable) |
| 48 | Ni-P | 8 | 1.9–2.3 | 1.2–1.7 | Good | 0 (Practicable) |
| 49 | Ni-P | 10 | 1.9–2.2 | 1.4–1.7 | Good | 0 (Practicable) |
| 50 | Cu-Zn | 30 | 1.8–2.1 | 1.2–1.6 | Good | 0 (Practicable) |
| 51 | Ni-P | 42 | 1.9–2.2 | 2.6–2.9 | Good | 0 (Practicable) |
| 52 | Ni-P | 3 | 0.6–0.9 | 1.2–1.7 | Good | 22 (Practicable) |
| 53 | Cu-Zn | 4 | 0.7–0.9 | 1.4–1.8 | Good | 17 (Practicable) |
| 54 | Ni-P | 5 | 1.9–2.5 | 1.4–1.9 | Good | 2 (Practicable) |
| 55 | Ni-P | 8 | 1.7–2.2 | 1.4–1.6 | Good | 0 (Practicable) |
| 56 | Ni-P | 10 | 1.8–2.4 | 1.3–1.7 | Good | 0 (Practicable) |
| 57 | Cu-Zn | 30 | 1.7–2.2 | 1.1–1.5 | Good | 0 (Practicable) |
| 58 | Ni-P | 43 | 1.8–2.2 | 2.7–2.9 | Good | 0 (Practicable) |

Metallized AlN substrate materials each having the same size as sample 10 of Example 1 and a high melting point metallizing layer formed by a co-fire metallizing method similar to that of Example 1 were prepared. Thus, ten metallized AlN substrate materials were prepared for each sample. Copper plates having Ni—B platings and Ni—P or Cu—P platings, of various thicknesses in a manner similar to that of Example 5 were bonded to the metallized AlN substrate materials via the intervening metal layers (plating layers) under the same conditions as set forth in Example 1.

Evaluations were made of the obtained samples in a manner similar to that or Example 5. The results are shown in Table 10. It can be seen from Table 10 that effects similar to those of the samples fabricated by the post-fire metallizing method of Example 3 were confirmed.

TABLE 11

| Sample | Ni Intervening Layer Thickness (μm) | Peel Strength (kg/1 mm) | Warp (μm/mm) | Area Analysis by Ultrasonic Flaw Detector Defective Portion (%) |
|---|---|---|---|---|
| 66 | 5 | 2.0–2.5 | 1.3–1.5 | 6 (Practicable) |
| 67 | 8 | 1.9–2.4 | 1.5–1.8 | 0 (Practicable) |
| 68 | 10 | 2.1–2.6 | 1.4–1.7 | 0 (Practicable) |
| 69 | 42 | 2.2–2.5 | 2.7–2.9 | 0 (Practicable) |

EXAMPLE 8

A member of sample 10 produced by the co-fire metallizing method of Example 1 and a member of each of

TABLE 10

| Sample | Kind of Plating | Plating Thickness (μm) | Peel Strength (kg/ 1 mm) | Warp (μm/mm) | External Appearance | Area Analysis by Ultrasonic Flaw Detector Defective Portion % |
|---|---|---|---|---|---|---|
| 59 | Ni-P | 3 | 0.7–1.1 | 1.4–1.7 | Good | 20 (Practicable) |
| 60 | Cu-P | 4 | 0.9–1.4 | 1.3–1.9 | Good | 13 (Practicable) |
| 61 | Ni-P | 5 | 3.1–3.6 | 1.6–1.8 | Good | 4 (Practicable) |
| 62 | Cu-P | 8 | 2.9–3.4 | 1.3–1.9 | Good | 0 (Practicable) |
| 63 | Ni-P | 10 | 3.2–3.6 | 1.4–1.8 | Good | 0 (Practicable) |
| 64 | Cu-P | 30 | 3.0–3.2 | 1.5–1.6 | Good | 0 (Practicable) |
| 65 | Ni-P | 42 | 3.0–3.2 | 2.6–2.9 | Good | 0 (Practicable) |

EXAMPLE 7

Metallized AlN substrate materials each having a high melting point metallizing layer formed by post-fire metallizing samples 4-a and 4-b shown in Table 4, which were produced as the comparative examples, were bonded to a Cu-made heat sink board by a eutectic solder, thereby fabricating semiconductor devices each having the structure shown in FIG. 3.

Specifically, the member of sample 10 is identical to the member 5 having the structure in which, as shown in FIG. 4, the W high melting point metallizing layer 2, the Ni—P intervening metal layer 3 and the copper conductor layer 4 are bonded to both sides of the AlN substrate material 1 in this order. This member 5 was bonded to the copper-made heat sink board 6 by using a eutectic solder 7, and the semiconductor element 8 was connected to the member 5 via the leads 9 by die-bonding in a manner known to those skilled in the art. Then, as shown in FIG. 3, the thus obtained product was accommodated into the casing 11 provided with the external terminals 12 and the casing 11 was filled with the resin filler layer 13, thus fabricating a semiconductor device.

Figure 5:
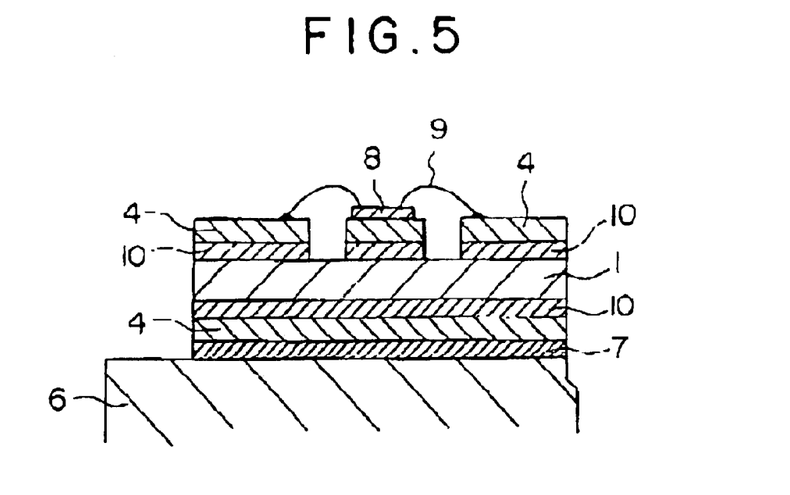
FIG. 5 is a schematic cross-sectional view showing a member for a semiconductor device which was produced as a comparative example of Example 8.

In the member of the comparative example, as shown in FIG. 5, as a bonding layer 10 substituted for both the W high melting point metallizing layer 2 and the Ni—P intervening metal layer 3 of sample 10, an Ag solder layer and a W high melting point metallizing layer (sample 4-a) or a Cu eutectic layer (sample 4-b) are (is) formed on each side of the AlN substrate material 1. The structures of the other parts of the comparative example and the structures of semiconductor devices when the semiconductor device elements 8 are mounted on these members are the same as those of sample 10 of the present invention shown in FIGS. 4 and 3.

Each of these semiconductor devices was subjected to a 1,000-cycle heat cycle test. In the semiconductor device provided with the member of the sample 10 of the present invention, no defect due to cracking or warp was observed around the peripheries of the AlN substrate material 1 and the Cu conductor layer 4. In contrast, in each of the semiconductor devices provided with the samples 4-a and 4-b, cracks running toward the AlN substrate material 1 were produced at the interface between the AlN substrate material 1 and the Cu conductor layer 4.

As is apparent from the above description, since the member according to the present invention has a connection structure in which an intervening metal layer is provided on an AlN substrate material provided with a high melting point metallizing layer and a conductor layer consisting mainly of copper is formed on the intervening metal layer, it is possible to provide a semiconductor device which has a markedly high reliability compared to any of the conventional connection structures. In particular, the member of the present invention which has the aforesaid connection structure has a superior reliability as a member for high-power modules.

In accordance with the present invention, it is possible to provide readily and inexpensively a highly reliable member for a semiconductor device, in which a metal member such as a lead frame made of copper, Kovar or the like is bonded to an aluminum nitride substrate material with high strength without cracking nor warp, preventing the substrate material from suffering damage or deformation which would have been caused by conventional bonding using soldering on a metallizing layer or copper oxide eutectic when the metal member is mounted on a conventional substrate material.

What is claimed is:

1. A member for a semiconductor device in which a high melting point metallizing layer consisting essentially of not less than 80 volume % of at least one high melting point metal selected from the group consisting of W, Mo, Ta, Ti and Zr and not greater than 20 volume % of glass frit, and an intervening metal layer which has a inciting point of not greater than 1,000° C. and consists essentially of at least one member selected from the group consisting of nickel, copper and iron or a member selected from the group consisting of nickel-phosphorous, nickel-boron, copper-zinc and copper-phosphorus are formed in this order on an aluminum nitride substrate material, and a conductor layer consisting essentially of copper is directly bonded as a circuit layer to said intervening metal layer, without forming an intervening solder layer, wherein said intervening metal layer is 2–40 μm in thickness.

2. A member for a semiconductor device, according to claim 1, in which, in the end shape of said conductor layer, the angle formed by a bonding interface between said conductor layer and said intervening metal layer and a side face of said conductor layer is not greater than 80°, whereas the angle funned by the upper surface and the side face of said conductor layer is not less than 80°.

3. A member for a semiconductor device according to claim 1, in which said high melting point metallizing layer is 3–50 μm in thickness.

4. A member for a semiconductor device according to claim 1, in which said intervening metal layer includes two layers, a nickel-boron layer and a nickel-phosphorus layer, formed in this order on said substrate material.

5. A method of manufacturing a member for a semiconductor device, in which a conductor layer consisting essentially of copper is bonded to an aluminum nitride substrate material, the method comprising the steps of:

coating a sintered aluminum nitride substrate material with a paste comprising at least one high melting point metal selected from the group consisting of W, Mo, Ta, Ti and Zr and a glass frit, and firing said paste to form a high melting point metallizing layer consisting essentially of not less 80 volume % of the high melting point metal and not greater than 20 volume % of the glass frit;

forming an intervening metal layer which has a melting point of not greater than 1,000° C. and consists of at least one selected from the group consisting of Ni, Cu and Fe or a member selected from the group consisting of nickel-phosphorous, nickel-boron, copper-zinc and copper-phosphorous, on either or both of said high melting point metallizing layer and a conductor layer consisting essentially of copper; and bonding said aluminum nitride substrate material to said conductor layer consisting essentially of copper as a circuit layer via said intervening metal layer at a temperature of less than the melting point of said conductor layer, without forming an intervening solder layer, wherein said intervening metal layer is 2–40 μm thickness.

6. A method of manufacturing a member for a semiconductor device, in which a conductor layer consisting essentially of copper is bonded to an aluminum nitride substrate material, the method comprising the steps of:

coating a compact comprising an aluminum nitride material powder with a paste comprising at least one high melting point metal selected from the group consisting of W, Mo, Ta, Ti and Zr and a glass frit, and then firing the body to obtain an aluminum nitride substrate material, the same time, form a high melting point metallizing layer consisting essentially of not less than 80 volume % of the high melting point metal and not greater than 20 volume % of the glass frit;

forming an intervening metal layer which has a melting point of not greater than 1,000° C. and consists essentially of one selected from the group consisting of Ni, Cu and Fe, or a member selected from the group consisting of nickel-phosphorous, nickel-boron, copper-zinc and copper-phosphorous, on either or both of said high melting point metallizing layer and a conductor layer consisting essentially of copper; and bonding said aluminum nitride substrate material to said conductor layer consisting essentially of copper as a circuit layer via said intervening metal layer at a temperature of less than the melting point of said conductor layer, without forming an intervening solder layer, wherein said intervening metal layer is 2–40 μm in thickness.

7. A semiconductor device in which a semiconductor element is die-bonded to the member for a semiconductor set forth in claim 1.

8. A member for a semiconductor device according to claim 1, wherein the planar length and width of said conductor layer are shorter than those of said high melting point metallizing layer and said intervening metal layer by not less than 0.05 mm.

9. A member for a semiconductor device according to claim 1, in which the planar length and width of said conductor layer are shorter than those of said high melting point metallizing layer and said intervening metal layer by not less than 0.05 mm.

10. A member for a semiconductor device according to claim 1, in which said intervening metal layer is made of nickel-phosphorus.

* * * * *